United States Patent

Hill et al.

[19]

[11] Patent Number: 6,133,762
[45] Date of Patent: Oct. 17, 2000

[54] FAMILY OF LOGIC CIRCUITS EMPLOTING MOSFETS OF DIFFERING THERSHOLD VOLTAGES

[75] Inventors: Anthony M. Hill, Dallas; Uming Ko, Plano, both of Tex.

[73] Assignee: Texas Instruments Incorporated, Dallas, Tex.

[21] Appl. No.: 09/050,402

[22] Filed: Mar. 30, 1998

Related U.S. Application Data

[60] Provisional application No. 60/042,894, Feb. 28, 1997.

[51] Int. Cl.[7] .......................... H03K 19/94; H03K 19/96; H03K 19/175
[52] U.S. Cl. .............................. 326/119; 326/98; 326/83
[58] Field of Search ..................................... 326/119, 112, 326/121, 93, 95, 98, 17, 83, 86

[56] References Cited

PUBLICATIONS

Rudolf F. Graf, Modern Dictionary of Electronics, Howard W. Sams & Co., Inc, pp. 165, 1984.

*Primary Examiner*—Michael Tokar
*Assistant Examiner*—James H. Cho
*Attorney, Agent, or Firm*—Robert D. Marshall, Jr.; W. James Brady, III; Frederick J. Telecky, Jr.

[57] ABSTRACT

This invention involves logic circuits formed of metal oxide semiconductor field effect transistors having differing threshold voltages. In a first embodiment, the logic circuit includes a first and a second series connection. The first series connection between a first supply voltage and an output node consists of a source-drain path of an N-channel transistor having a high threshold voltage and a pull-down conditional conduction path of a pull-down network constructed exclusively of transistors having a low threshold voltage. The second series connection between said supply voltage and said output node consists of a source-drain path of a P-channel transistor having the high threshold voltage and a pull-up conditional conduction path of a pull-up network constructed exclusively of transistors having the low threshold voltage. The two high threshold voltage MOSFETs receive at their respective gates inverse signals so that either both are conducting or both are off. The pull-down network and pull-up network each receives input signals which control whether they conduct. These input signals are preferably selected so that the pull-down network and pull-up network do not conduct simultaneously. The two parts of each series connection may be in either order. The first input signal is preferably a clock signal. The pull-down network is preferably constructed exclusively of N-channel transistors. The pull-up network is preferably constructed exclusively of P-channel transistors.

23 Claims, 3 Drawing Sheets

FAMILY OF LOGIC CIRCUITS EMPLOTING MOSFETS OF DIFFERING THERSHOLD VOLTAGES

This application claims priority under 35 USC 119(e) (1) of provisional application No. 60/042,894, filed Feb. 28, 1997.

TECHNICAL FIELD OF THE INVENTION

The technical field of this invention is families of transistor circuit configurations and are more particularly logic circuits using transistors having differing threshold voltages.

CROSS-REFERENCES TO RELATED APPLICATIONS

This application is related to the following patent applications, each of which is hereby incorporated herein by reference:

U.S. patent application Ser. No. 08/687,800, entitled "DYNAMIC LOGIC CIRCUITS USING TRANSISTORS HAVING DIFFERING THRESHOLD VOLTAGES", with inventor Patrick W. Bosshart, and filed Jul. 19, 1996;

U.S. patent application Ser. No. 08/683,996, entitled "DYNAMIC LOGIC CIRCUITS USING CASCODE TRANSISTORS HAVING LOW THRESHOLD VOLTAGES", with inventor Patrick W. Bosshart, and filed Jul. 19, 1996; and U.S. patent application Ser. No. 08/684,369, entitled "POWER REDUCTION CIRCUITS AND SYSTEMS FOR DYNAMIC LOGIC GATES", with inventor Patrick W. Bosshart, and filed Jul. 19, 1996.

BACKGROUND OF THE INVENTION

In many modern circuit applications, it is desirable to increase the speed of operation of the circuit application. For example, in microprocessor design the circuits which make up speed-limiting portions or affect the speed of the microprocessor are constantly scrutinized and re-designed to increase the overall microprocessor speed. Increased speed increases performance and, therefore, permits more detailed and sophisticated processing capabilities in a shorter amount of time. It is known in the CMOS (complementary metal oxide semiconductor) manufacturing art to target the threshold voltage of transistors given certain circuit expectations. Particularly, typically a manufacturer will build transistors, or make available transistor fabrication processes, which include transistors of a given threshold voltage. When providing this process, the manufacturer typically considers the tradeoff in speed improvement versus power consumption. To increase operational speed, it is known that the threshold voltage of all of the transistors within a circuit may be reduced. By reducing the threshold voltage, the drive current of these transistors is increased. However, the leakage current of those same transistors is also increased. This approach becomes even more limiting as power supply voltages are reduced and the threshold voltage of the transistor becomes a greater percentage of the power supply voltage. Consequently, one approach is to lower the threshold voltage of the transistor but this increases current leakage and therefore also increases overall standby power consumption. Thus, often a manufacturer anticipates a certain level of leakage to be the acceptable limit, and in view of that limit, adjusts known parameters so that each of the transistors of the circuit share a designated threshold voltage which will provide that limit.

As MOSFET (metal oxide semiconductor field effect transistor) process technology continues to scale to smaller transistors, both gate length and gate oxide thickness decrease. This mandates a supply voltage ($V_{dd}$) reduction to maintain MOSFET gate integrity. Although power dissipation is decreasing favorably according to $V_{dd}^2$ due to scaling, the propagation delay degrades proportional to ($V_{dd}$-Vt). Thus, to both enhance performance and reduce power dissipation, multiple-threshold-voltage MOSFETs are crucial for deep sub-micron CMOS processes, especially when $V_{dd}$ is in the one volt range. However, the low-Vt MOSFET must be applied to the circuit architecture judiciously to maintain proper noise immunity and to prevent excessive subthreshold leakage power dissipation which is detrimental to any power management techniques of an energy-sensitive microprocessor design.

While the above approaches are representative of the art for advancing circuit operational speed, they provide various limitations or drawbacks. For example, the logic speed is still limited by the threshold voltage of the transistors used in the logic. As another example, and as mentioned above, an advance in speed by reducing threshold voltage necessarily increases standby power consumption caused by leakage current. This invention provides increased circuit speed while reducing leakage current as compared to the current state of the art.

SUMMARY OF THE INVENTION

This invention involves logic circuits formed of metal oxide semiconductor field effect transistors having differing threshold voltages. In a first embodiment, the logic circuit includes a first and a second series connection. The first series connection between a first supply voltage and an output node consists of a source-drain path of an N-channel transistor having a high threshold voltage and a pull-down conditional conduction path of a pull-down network constructed exclusively of transistors having a low threshold voltage. The second series connection between said supply voltage and said output node consists of a source-drain path of a P-channel transistor having the high threshold voltage and a pull-up conditional conduction path of a pull-up network constructed exclusively of transistors having the low threshold voltage. The two high threshold voltage MOSFETs receive at their respective gates inverse signals so that either both are conducting or both are off. The pull-down network and pull-up network each receives input signals which control whether they conduct. These input signals are preferably selected so that the pull-down network and pull-up network do not conduct simultaneously. The two parts of each series connection may be in either order. The first input signal is preferably a clock signal. The pull-down network is preferably constructed exclusively of N-channel transistors. The pull-up network is preferably constructed exclusively of P-channel transistors.

One embodiment of this logic circuit forms a hybrid tri-state inverter in which the pull-down network is the source-drain path of an N-channel transistor having a gate receiving a tri-state input signal and the pull-up network is the a source-drain path of a P-channel transistor having a gate receiving the tri-state input signal. The enable signal and its inverse are supplied to the high threshold voltage transistors.

Another embodiment of this logic circuit forms a 4 to 1 hybrid threshold voltage tri-state multiplexer. Two input stages employing oppositely driven transmission gates supply inputs to two oppositely driven tri-state inverters.

Another embodiment of this logic circuit is a latching logic circuit. A pair of clocked high threshold voltage P-channel transistors connect the supply voltage to respective output nodes. A logic network constructed exclusively of low threshold voltage N-channel transistors selectively couples one and only one of the output nodes to ground via a clocked high threshold voltage N-channel transistors. A pair of cross-coupled low threshold N-channel transistors latch the output via a high threshold voltage N-channel transistor.

A further embodiment of the logic circuit includes a series connection of first logic network constructed exclusively of P-channel transistors having a low threshold voltage, a second logic network constructed exclusively of N-channel transistors having the low threshold voltage and a third logic network constructed exclusively of N-channel transistors having the high threshold voltage. The logic networks selectively conduct based upon their inputs. The output is taken at the junction between the first and second logic networks.

A yet further embodiment of this invention is a 2 to 1 hybrid threshold voltage tri-state multiplexer.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
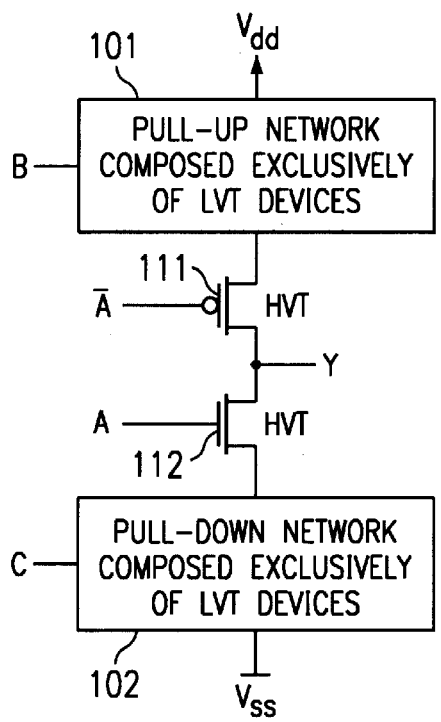
FIG. 1 illustrates in partial block and partial schematic form the construction of a logic circuit having transistors of two differing threshold voltages in accordance with this invention.

In the preferred embodiment, logic circuits are constructed of MOSFETs having two different threshold voltages ("$V_T$"). In this application, the Figures will may individually designate whether MOSFETs are constructed with a high threshold voltage (HVT) or with a low threshold voltage (LVT). Alternatively, the Figures may designate logic functions constructed with MOSFETS each of which are of either a high threshold voltage (HVT) type or of a low threshold voltage (LVT) type. The Figures will make clear which MOSFETs are constructed with these two threshold voltages.

Before detailing the significance of the use of a low threshold voltage transistor versus a high threshold voltage transistor, note that these terms are used to designate the relative values of one transistor's threshold voltage versus another transistor's threshold voltage and are not necessarily limiting those terms to certain absolute values. Particularly, it is known in the art that a transistor's threshold voltage may be determined by measuring its current-voltage characteristics to determine a gate-to-source voltage where the transistor conducts a small amount of current. To demonstrate the relative nature of threshold voltages, consider the following. For a first transistor with a first threshold voltage, it will provide a first amount of drive current at a given drain-to-source voltage (with its gate connected to its drain). For a second transistor with a second threshold voltage lower than that of the first transistor, the second transistor will provide a second amount of drive current at the given drain-to-source voltage (with its gate connected to its drain), and which drive current is larger than the first amount of drive current provided by the first transistor at that same drain-to-source voltage. For the remainder of this application, a transistor of the first type will be referred to as an HVT transistor (i.e., a transistor with a relatively high $V_T$) while a transistor of the second type will be referred to as an LVT transistor (i.e., a transistor with a relatively low $V_T$). Further, note that an HVT transistor preferably has a $V_T$ on the order of that for transistors which are now used throughout a circuit where all transistors share the same $V_T$, and where that $V_T$ was determined to be high enough to avoid unacceptably large leakage currents. It is known in the art that an LVT transistor provides the benefit of a higher drive current as opposed to an HVT transistor. It is also known in the art that a LVT transistor provides a greater leakage current than an HVT transistor. Indeed, the typical leaking by an LVT transistor may be greater than that of an HVT transistor by two or three orders of magnitude or more. In the prior art all of the transistors of a particular circuit were typically constructed to have the same high $V_T$. This high $V_T$ was selected to avoid the unacceptably large leakage current which would exist if a lower $V_T$ were used. The above referenced co-pending patent applications present a number of circuit types with mixed HVT and LVT transistors in which leakage current is minimized. This application presents additional circuits types having this same benefit.

Before proceeding with the benefits of the above-stated distinction where the present embodiments use both HVT and LVT transistors, note then that the embodiments described in this application may be constructed in various manners in order to accomplish different transistors having differing threshold voltages. As a first example, one manner of accomplishing this goal could be using a manufacturing process which specifically permits the creation of logic circuits using transistors having differing threshold voltages. For example, in current technology, typically a single semiconductor area (e.g. a wafer) is masked and the exposed areas are exposed to an implant which establishes the threshold voltage for the exposed transistor channels of a first conductivity type. For example, the $V_T$ of all n-channel transistors may be set by using this process. Repeating this process with a different mask set for sets the $V_T$ for all p-channel transistors. Thus, using two implant steps, the $V_T$ is set for both n-channel and p-channel transistors. Additionally, for both conductivity types, the depth and/or concentration of the implant used in this manner affects the level of the threshold voltage resulting from the exposure. Under current standards, a common transistor may have a $V_T$ on the order of 500 millivolts. The methodology, however, may be expanded to provide at least two different sets of transistors, where both sets have the same conductivity type but one set includes HVT transistors while the other includes LVT transistors. Using this expanded methodology, and for one conductivity type, a first set of masks could be used to create a set of HVT transistors in the appropriate locations while a second set of masks could be used to create a set of LVT transistors in differing locations. Thus, for a given transistor conductivity types, one implant would take place using the first set of masks to create the HVT transistors. Another implant would take place using the second set of masks to create the LVT transistors. Additionally, for the second transistor conductivity type, two more sets of masks and implants would be employed in a like manner. Moreover, to contrast with the 500 millivolt $V_T$ of the HVT transistors, current transistor technology may expect a $V_T$ on the order of 200 millivolts for an LVT transistor. Moreover, these values may vary according to various considerations known in the art. In addition to the above, note further that the formation and/or construction of an HVT transistor versus an LVT transistor may be accomplished by other techniques as well. As another example, some transistors are formed using what is known as silicon-on-insulator ("SOI") technology. In this technology, each SOI transistor includes a separate body connection. Typically, the body is either connected to a certain node, or is allowed to float. This separately available connection may be further used to accomplish the relative $V_T$ standards set forth in this application. Additional considerations in this regard may arise in the future once the levels of $V_{DD}$ fall below a diode forward-bias voltage level for such a transistor. Given current $V_{DD}$ levels, which are still considerably higher than a typical forward-bias voltage of about 0.8 volts, and where it is desired to create an LVT configuration, it is acceptable to disconnect the transistor body, thereby allowing it to float. Conversely, given the same $V_{DD}$, and where it is desired to create an HVT configuration, it is acceptable to connect the transistor body to ground for an n-channel transistor (or to $V_{DD}$ for a p-channel transistor). In addition to the above, note that at some point in the future $V_{DD}$ levels should fall to 0.5 volts or less and, therefore, fall considerably below a typical expected forward-bias voltage of 0.8 volts. In this instance, and where it is desired to create an LVT configuration, it will as before be acceptable to disconnect the transistor body, thereby allowing it to float. As a result, the threshold voltage of that transistor during the precharge phase is relatively low. In contrast, where it is desired to create an HVT configuration, the transistor body may be connected to the transistor's gate which is known to be off during the phase in which a high threshold voltage (e.g., during the precharge phase) is desired. For example, for an n-channel SOI transistor connected in this manner, the low gate voltage during precharge is also connected to the body of that transistor. As a result, the threshold voltage of that transistor during the precharge phase is relatively high. Indeed, a relatively higher $V_T$ also may be accomplished by connecting the transistor body to a potential which is non-enabling for the transistor (e.g., connect the body to ground for an n-channel transistor), or to the source of that transistor or to a different signal which is at ground during precharge. Still other techniques should be ascertainable by a person skilled in that art and the particular technique chosen need not be detailed herein. For example, there are currently manufacturing techniques used in static circuits where certain transistors may be LVT transistors while other transistors may be HVT transistors. This technique is used so that an entire area, such as a set of circuits on an entire circuit die, are constructed using LVT transistors to increase the speed of that set of circuits, but with the recognition that the area constructed in this fashion will have an increased amount of current leakage as compared to the remaining areas on the circuit die which are constructed using HVT transistors. Thus, by modifying this technique or using other techniques available to a person skilled in the art, for purposes of the present embodiments it need be possible that a given circuit may be constructed by intentionally specifying differing threshold voltages for different transistors with the choice of either LVT or HVT transistors within a circuit configuration guided by the embodiments set forth in this document.

Figure 2:
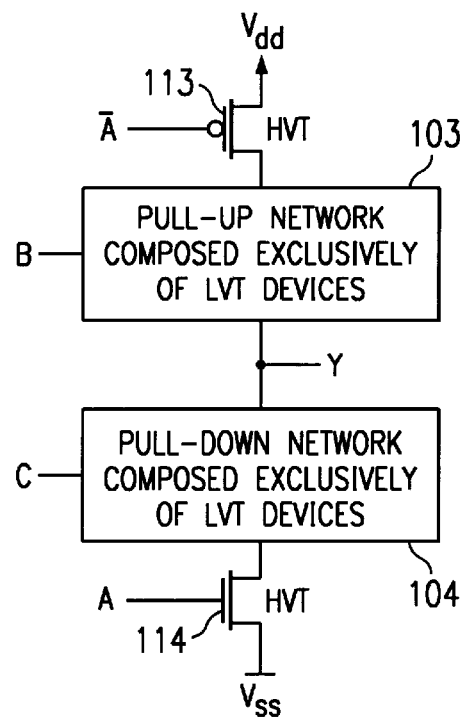
FIG. 2 illustrates in partial block and partial schematic diagram form a logic circuit having an alternate construction from that illustrated in FIG. 1.

FIGS. 1 and 2 illustrate two alternative circuit families using mixed voltage threshold transistors. These alternative circuit families rely upon the existence of two complementary enabling signals A and $\overline{A}$. In FIG. 1, the supply voltage $V_{dd}$ may be connected to the output node Y via the series connection of pull-up network 101 and P-channel HVT transistor 111. Pull-up network 101 is constructed entirely of LVT transistors. Pull-up network 101 includes one or more inputs B. Certain conditions of the input(s) B will result in pull-up network 101 providing a current path between the supply voltage $V_{dd}$ and the source of transistor 111. All other conditions of the input(s) B break this path preventing any connection between the supply voltage $V_{dd}$ and the source of transistor 111. The ground voltage $V_{ss}$ may be connected to the output node Y via the series connection of N-channel HVT transistor 112 and pull-down network 102. Pull-down network 102 is constructed entirely of LVT transistors. Pull-down network 102 includes one or more inputs C. Certain conditions of the input(s) C will result in pull-down network 102 providing a current path between the drain of transistor 112 and the ground voltage $V_{ss}$. All other conditions of the input(s) C break this path preventing any connection between the drain of transistor 112 and the ground voltage $V_{ss}$. The circuit of FIG. 1 implements the logic function ($\overline{A}$ AND B) OR NOT(A AND C), where B represents the function of all input(s) B and C represents the function of all input(s) C.

The circuit type of FIG. 1 employs the superior switching speed of LVT transistors while preventing disadvantageously large leakage currents. Note that leakage currents occur only when a transistor is nominally OFF. In FIG. 1 the complementary enabling signals A and $\overline{A}$ guarantee that both transistors 111 and 112 are either ON or both are OFF at any time. If A is active, then both HVT transistor 111 and HVT transistor 112 are ON. In this case the output Y may be pulled up to $V_{dd}$ by pull-up network 101 or may be pulled down to $V_{dd}$ by pull-down network 102. In either case the response of the circuit to changes in input(s) B or changes to input(s) C is faster than the case if the networks were composed entirely of HVT transistors.

If A is inactive, then both pull-up network 101 and pull-down network 102 are cut off from output Y. Regardless of the state of pull-up network 101 or pull-down network 102 leakage current is small. This is because when A is inactive, any leakage current must pass through a cut off HVT transistor. Because HVT transistors have a relatively low leakage current, that is they present a high impedance when cut off, the leakage current will be small.

The circuit of FIG. 1 presents two cases in which leakage current will be greater than if all HVT transistors were used for pull-up network 101 and pull-down network 102. If A is active and the B input(s) cause pull-up network 101 to be inactive, a leakage current will flow through the LVT transistors of pull-up network 101. Similarly, if A is active and the C input(s) cause pull-down network 102 to be inactive, a leakage current will flow through pull-down network 102. These leakage currents will be greater than if the networks were constructed solely HVT transistors. This is somewhat mitigated by the source-drain voltage drop across HVT transistors 111 and 112. This source-drain drop across the HVT transistors reduces the total potential across the networks. The leakage current is dependent upon the difference between the gate-source voltage $V_{GS}$ and the threshold voltage $V_T$. The source-drain voltage drop across the HVT transistors 111 and 112 reduces the maximum gate-source voltage across any particular LVT transistor within the networks, thus reducing the maximum leakage current.

Note that FIG. 1 exhibits the possibility of a short circuit current path from $V_{dd}$ to $V_{ss}$. If A is active and both the B input(s) cause pull-up network 101 to conduct and the C input(s) cause pull-down network 102 to conduct, a current path exists between $V_{dd}$ to $V_{ss}$ For this reason the input(s) B and C should be so limited that both pull-up network 101 and pull-down network 102 cannot conduct simultaneously. The following specific circuits includes examples which satisfy this condition.

FIG. 2 illustrates an alternative construction to that of FIG. 1. In FIG. 2, the supply voltage $V_{dd}$ may be connected to the output node Y via the series connection of P-channel HVT transistor 113 and pull-up network 103. Pull-up network 103 is constructed entirely of LVT transistors and includes one or more inputs B. The ground voltage $V_{ss}$ may be connected to the output node Y via the series connection of pull-down network 104 and N-channel HVT transistor 114. Pull-down network 104 is constructed entirely of LVT transistors and includes one or more inputs C. The circuit of FIG. 2 also implements the logic function (A AND B) OR NOT(A AND C). The discussion above regarding leakage current and short circuit current are equally applicable to FIG. 2.

Figure 3:
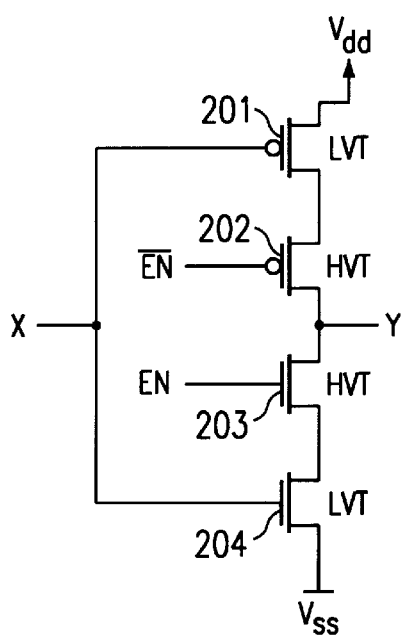
FIG. 3 illustrates a hybrid threshold voltage tri-state inverter.

FIG. 3 illustrates an example of a practical circuit constructed according to the principles of FIG. 1. FIG. 3 illustrates a hybrid $V_T$ tri-state inverter circuit. Tri-state inverters are commonly used as building blocks for bus drivers, latches and flip-flops. The series connection of P-channel LVT transistor 201 and P-channel HVT transistor 202 conditionally connects the supply voltage $V_{dd}$ to the output Y. The series connection of N-channel HVT transistor 203 and N-channel LVT transistor conditionally connects the output Y to the ground voltage $V_{dd}$. The gate of HVT transistor 203 receives an enable signal EN. The gate of HVT transistor 202 receive an inverse enable signal $\overline{EN}$. When the enable signal EN is an inactive low, both HVT transistors 202 and 203 are cut off. This presents a high impedance to output Y. Any leakage current path must pass through one of the cut off HVT transistors 202 or 203. Since these transistors have high threshold voltages, they have very little conductance and any leakage current is minimized. When the enable signal EN is active, both HVT transistors are conducting. The circuit of FIG. 3 inverts the input signal X on the output Y. If the input X is an active high, the LVT transistor 201 is cut off and LVT transistor 204 conducts. This produces a low signal near ground $V_{ss}$ at the output Y. If the input X is an inactive low, then LVT transistor 201 conducts and LVT transistor 204 is cut off. This produces a high signal near the supply voltage $V_{dd}$ at the output Y. Note that providing LVT transistor 201 and LVT transistor 204 of opposite conductivity types ensures that these transistors will not simultaneously conduct. This satisfies the condition needed to prevent a short circuit path from $V_{dd}$ to $V_{ss}$.

Table 1 shows the comparison of circuit simulations for three variations of the circuit of FIG. 3. The first listed circuit is a tri-state inverter in which all the transistors 201, 202, 203 and 204 are HVT transistors in accordance with the prior art. The second listed circuit is a tri-state inverter in which all the transistors 201, 202, 203 and 204 are LVT transistors. The final listed circuit is the circuit illustrated in FIG. 3 in which transistors 201 and 204 are LVT transistors and transistors 202 and 203 are HVT transistors.

TABLE 1

| Parameters 1.8 volts, 100 MHZ | Conventional All HVT | All LVT | Hybrid LVT/HVT | Units |
| --- | --- | --- | --- | --- |
| Average delay | 838 | 618 | 676 | ps |
| percentage | 100 | 74 | 81 | % |
| Standby Current | 5 | 273 | 6 | pA |
| percentage | 100 | 5460 | 120 | % |
| Energy | 0.8 | 30.4 | 0.7 | pJ |

The percentages listed have the conventional all HVT transistor circuit set to 100% as the reference. These circuit simulations assume a supply voltage $V_{dd}$ of 1.8 volts and a frequency of 100 MHZ. The delay simulation is based upon the time from the transition of the input X to the corresponding transition of the output Y when the enable signal EN is active. The standby current was simulated for conditions when the enable signal is inactive and the voltage at the input X is 0.1 volts. Table 1 shows that the all LVT transistor circuit is fastest but has very much greater standby current. The inventive circuit illustrated in FIG. 3 includes most of the speed benefit of an all LVT transistor circuit with much less increase in standby current. The increase in speed of the circuit of FIG. 3 over the prior art all HVT transistor circuit enabled a decrease in total energy use even accounting for the increased standby current.

Figure 4:
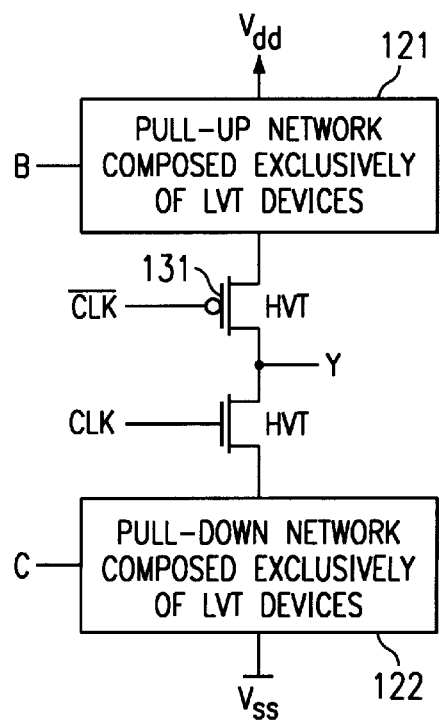
FIG. 4 illustrates a clocked CMOS circuit constructed according to the model of FIG. 1.

FIG. 4 illustrates a clocked CMOS circuit constructed according to the model of FIG. 1. In the case of FIG. 4, the A input is the CLK input and the $\overline{A}$ input is the inverted CLK ($\overline{CLK}$) input. Pull-up network 121 and pull-down network 122 are constructed entirely of LVT transistors. As previously discussed, pull-up network 121 and pull-down network 122 must be complementary. Thus no possible conditions of input(s) B and C can cause both pull-up network 121 and pull-down network 122 to conduct simultaneously.

Figure 5:
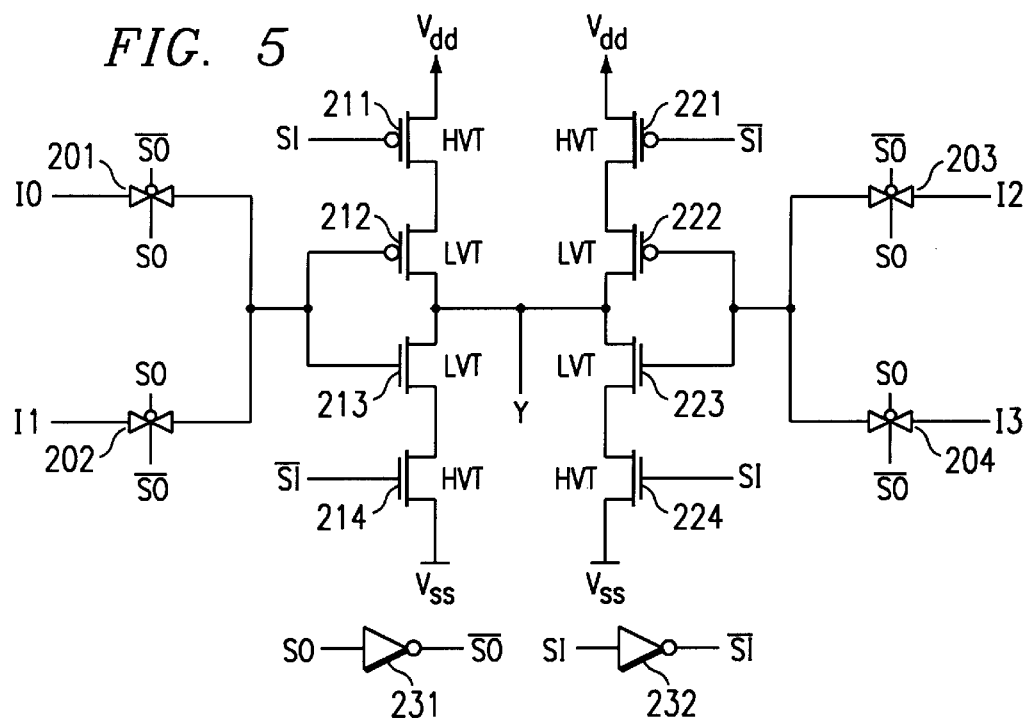
FIG. 5 illustrates a 4-to-1 multiplexer circuit employing a pair of hybrid threshold voltage tri-state inverters.

FIG. 5 illustrates a 4-to-1 multiplexer circuit employing a pair of tri-state inverters. The tri-state inverter of FIG. 5 are constructed in accordance with the model illustrated in FIG. 2. The multiplexer of FIG. 5 receives four input signals, I0, I1, I2 and I3 at respective input terminals. This multiplexer also receives two select signals, S0 and S1, at respective control terminals. The multiplexer supplies an inverted version of one of the input signals I0 to I3 to its output Y depending on the state of the two selection signals S0 and S1. Table 2 shows the truth table of this multiplexer.

TABLE 2

| S0 | S1 | Output |
| --- | --- | --- |
| 1 | 0 | I0 |
| 0 | 0 | I1 |
| 1 | 1 | I2 |
| 0 | 1 | I3 |

This multiplexer operates in two stages. Transmission gates 201 and 202 select between inputs I0 and I1 depending on the control input S0. If S0 is active, the transmission gate 201 conducts and transmission gate 202 is cut off, thus selecting input I0. If S0 is inactive, transmission gate 201 is cut off and transmission gate 202 conducts, thus selecting input I1. Likewise, transmission gates 203 and 204 select between inputs I2 and I3 depending on the control input S0. If S0 is active, the transmission gate 203 conducts and transmission gate 204 is cut off, thus selecting input I2. If S0 is inactive, transmission gate 203 is cut off and transmission gate 204 conducts, thus selecting input I3. Transmission gates 102, 202, 203 and 204 are preferably constructed of all HVT transistors. The second stage of selection takes place in two tri-state inverters. The first tri-state inverter consists of HVT P-channel transistor 211, LVT P-channel transistor 212, LVT N-channel transistor 213 and HVT N-channel transistor 214. The gates of LVT P-channel transistor 212 and LVT N-channel transistor 213 receive the output of the first stage from the selected one of the transmission gates 201 and 202. If S1 is active, both HVT P-channel transistor 211 and HVT N-channel transistor 214 are cut off. This presents a high impedance to the output Y, isolating inputs I0 and Ii from the output Y. If S1 is inactive, both HVT P-channel transistor 211 and HVT N-channel transistor 214 conduct the selected input I0 or I1 to the output Y. The second tri-state inverter consists of HVT P-channel transistor 222, LVT P-channel transistor 222, LVT N-channel transistor 223 and HVT N-channel transistor 244. The gates of LVT P-channel transistor 222 and LVT N-channel transistor 223 receive the output of the first stage from the selected one of the transmission gates 203 and 204. If S1 is active, both HVT P-channel transistor 221 and HVT N-channel transistor 224 conduct. This couples the inverse of the input selected by transmission gates 203 and 204 to the output Y. If S1 is inactive, then the first tri-state inverter including transistors 211, 212, 213 and 214 couples the input selected by transmission gates 201 and 202 to the output Y. The second tri-state inverter including transistors 221, 222, 223 and 224 is placed in its high impedance state and inputs I2 and I3 are isolated from then output Y. Because the two tri-state inverters are oppositely enabled, one of these tri-state inverters is always in the high impedance isolated state. Thus there is never any voltage contention at the wired OR at output Y.

FIG. 5 further illustrates inverters 231 and 231. These inverters form the inverted control signals $\overline{S1}$ and $\overline{S2}$, respectively. These inverters are preferably constructed using only HVT transistors.

The tri-state inverters illustrated in FIG. 5 are constructed according to the model of FIG. 2. These tri-state inverters differ from the tri-state inverter illustrated in FIG. 3 in the series order of the LVT and the HVT transistors. As described in conjunction with FIGS. 1 and 2, these differing forms are equivalent.

Figure 6:
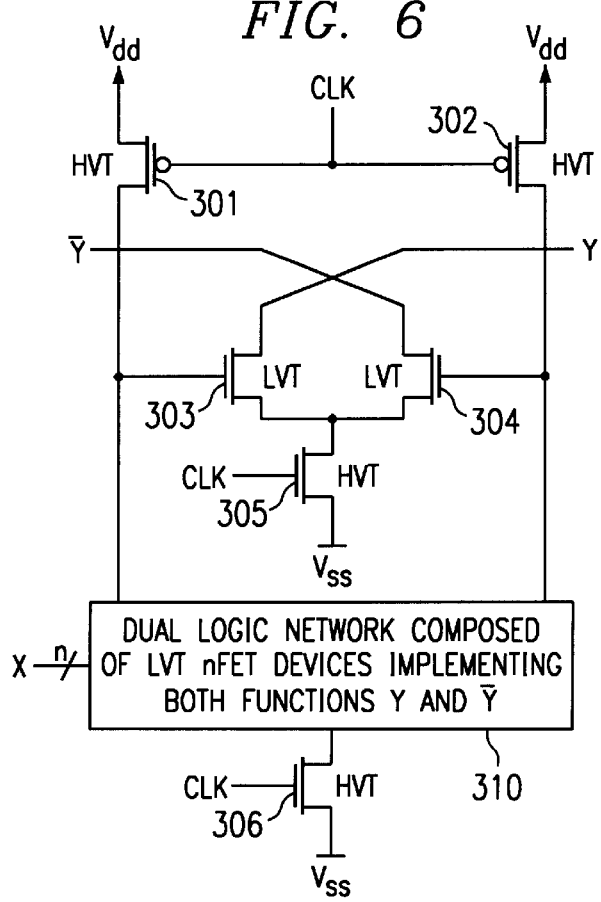
FIG. 6 illustrates a cascode voltage switch logic circuit employing hybrid threshold voltage elements.

FIG. 6 illustrates a clocked cascode voltage switch logic circuit employing hybrid threshold voltages. During a precharge phase the clock signal turns ON both P-channel HVT MOSFETs 301 and 302. This couples the supply voltage to the true output Y and the false output $\overline{Y}$. During an evaluation phase the inputs X to logic network 310 conditionally connects one of the true output Y and the false output $\overline{Y}$ to N-channel HVT MOSFET 306. Logic network 310 includes only LVT N-channel MOSFETs. Note that logic network 310 is constructed to place opposite conditions on the true output Y and the false output $\overline{Y}$. N-channel HVT MOSFET 306 is enabled out of phase with P-channel HVT MOSFETS 301 and 302 due to its differing conductivity type. Also during the evaluate phase the true output Y and the false output $\overline{Y}$ are latched via cross-coupled N-channel LVT MOSFETs 303 and 304. N-channel LVT MOSFETs 303 and 304 are enabled during the evaluate phase by clocked N-channel HVT MOSFET 305. During the precharge phase, N-channel HVT MOSFET 305 is turned OFF disabling N-channel LVT MOSFETs 303 and 304. Since every path from the supply voltage $V_{dd}$ to the reference voltage $V_{ss}$ passes through a HVT transistor, leakage current is minimized. However, the logic network 310 because it includes only LVT transistors operates faster than if it were constructed only of HVT transistors.

Figure 7:
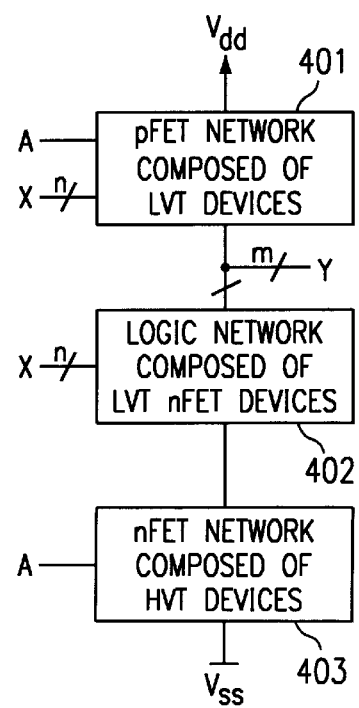
FIG. 7 illustrates an example of static ratio logic using hybrid voltage threshold elements.

FIG. 7 illustrates a further logic family type. A first logic network 401 receives an input signal A and at least one further input signal X. First logic network 401 is constructed exclusively of P-channel LVT transistors. Depending upon the state of the input signal A and the at least one input signal X, first logic network 401 selectively couples the supply voltage $V_{dd}$ to the at least one output Y. Second logic network 402 is constructed exclusively of N-channel LVT transistors. Depending upon the state of the at least one input X, second logic network 402 selectively connects the at least one output Y to third logic network 403. Third logic network 403 is constructed exclusively of N-channel HVT transistors. Depending upon the state of input A, third logic network 403 selectively connects second logic network 402 to the reference voltage $V_{ss}$. Because first logic network 401 and second logic network 403 are of differing conductivity types, they respond oppositely to the input A. This prevents a short circuit path from $V_{dd}$ to $V_{ss}$. Excess leakage current is substantially reduced due to the HVT transistors in third logic network 403.

Figure 8:
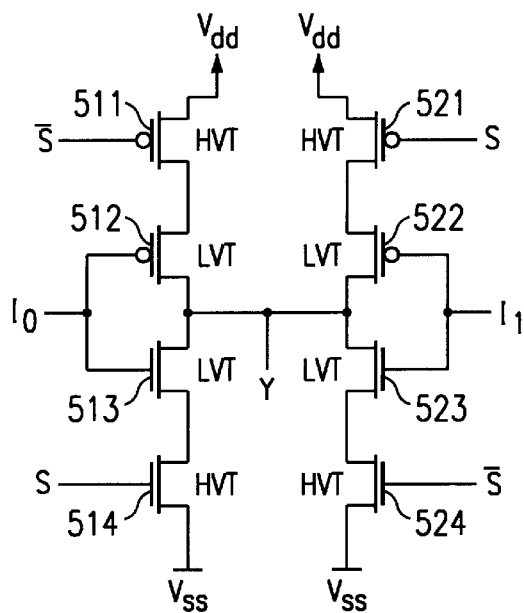
FIG. 8 illustrates a first embodiment of a hybrid threshold voltage 2-to-1 multiplexer employing a tri-state inverter.

FIGS. 8, 9, 10 and 11 illustrate various alternative embodiments of a hybrid tri-state inverter 2-to-1 multiplexer. In FIG. 8 a first tri-state inverter consists of P-channel HVT transistor 511, P-channel LVT transistor 512, N-channel LVT transistor 513 and N-channel HVT transistor 514. The first input signal I0 is supplied to the gates of P-channel transistor 512 and N-channel transistor 513. The gate of P-channel transistor 511 receives the inverse of the control signal S. The gate of N-channel transistor 514 receives the control signal S. A similar tri-state inverter consists of P-channel HVT transistor 521, P-channel LVT transistor 522, N-channel LVT transistor 523 and N-channel HVT transistor 524. The second input signal I1 is supplied to the gates of P-channel transistor 522 and N-channel transistor 523. The gate of P-channel transistor 521 receives the control signal S. The gate of N-channel transistor 514 receives the inverse of the control signal S. The output nodes of the two tri-state inverters are coupled together to form the multiplexer output Y. If the control signal S is 0, then both P-channel transistor 511 and N-channel transistor 514 are turned ON. This couples the first input I0 to the output Y. At the same time both P-channel transistor 521 and N-channel transistor 521 are turned OFF, thus isolating the second input I1 from the output Y. Thus the state of control signal S enables selection of either the first input signal I0 or the second input signal I1.

Figure 9:
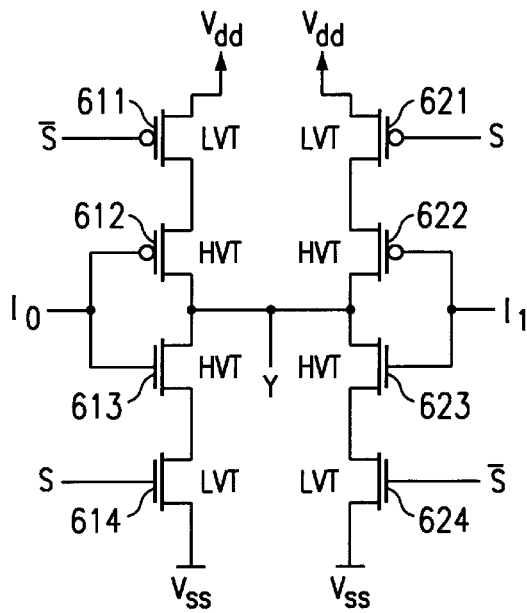
FIG. 9 illustrates a second embodiment of a hybrid threshold voltage 2-to-1 multiplexer employing a tri-state inverter.

FIG. 9 illustrates an alternative to the multiplexer of FIG. 8. In FIG. 9 the threshold voltage of each transistor is reversed in relationship to that of the corresponding transistor in FIG. 8. Thus P-channel transistors 611 and 621 have the low threshold voltage, P-channel transistors 612 and 622 have the high threshold voltage, N-channel transistors 613 and 623 have the high threshold voltage and N-channel transistors 613 and 624 have the low threshold voltage. These two alternatives are selected based upon the relative switching speed desired between the control signal and the two input signals. If the fastest switching speed is desired for the two input signals, then the alternative of FIG. 8 is selected. In FIG. 8 the input signals drive the gates of the LVT transistors which switch faster. If the fastest switching speed is desired for the control signal, then the alternative of FIG. 9 is selected in which the control signal drives the gates of the LVT transistors.

Figure 10:
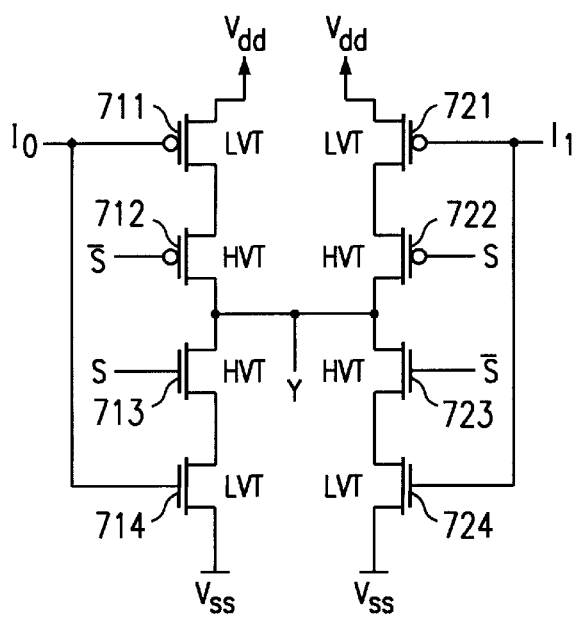
FIG. 10 illustrates a third embodiment of a hybrid threshold voltage 2-to-1 multiplexer employing a tri-state inverter.

The alternative multiplexer of FIG. 10 is similar to that of FIG. 8, except that the relative order of the transistors has been switched. Thus the first input signal I0 drives the gates of the outer transistors 711 and 714 and the control signal and its inverse drive the gates of the respective inner transistors 713 and 712. In the same fashion the second input signal I1 drives the gates of the outer transistors 721 and 724 and the respective control signal and its inverse drive the inner transistors 722 and 723. The selection between the alternatives in FIGS. 8 and 10 depends upon the expected arrival times of the input and control signals. It is believed best if the last arriving signal drives the inner transistors. Thus the alternative of FIG. 8 should be selected if the input signals are expected to switch after the control signal. On the other hand, the alternative illustrated in FIG. 10 should be selected if the control signal is expected to switch after the input signals.

Figure 11:
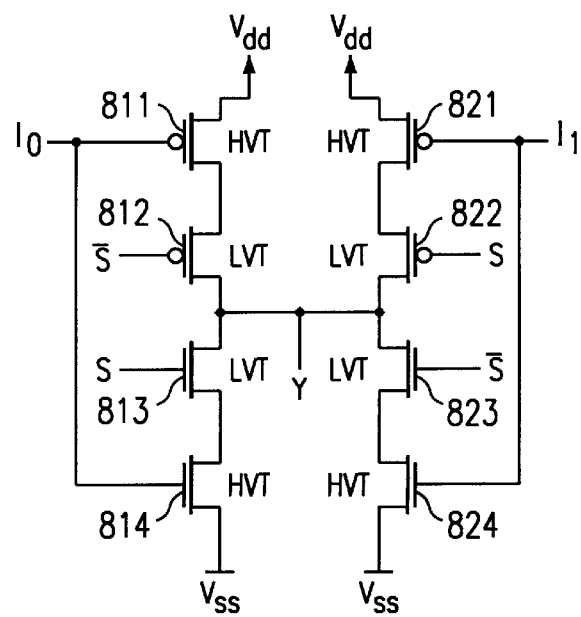
FIG. 11 illustrates a fourth embodiment of a hybrid threshold voltage 2-to-1 multiplexer employing a tri-state inverter.

The final alternative is illustrated in FIG. 11. This alternative is similar to FIG. 9 except that the relative order of the transistors has been switched. In FIG. 9 the input signals drive the outer transistors 811, 814, 821 and 824 and the control signal drives the inner transistors 812, 813, 822 and 824. Selection between the alternatives of FIGS. 9 and 11 is based upon the expected arrival times of the input and control signals as described above.

What is claimed is:

1. A logic circuit family formed of metal oxide semiconductor field effect transistors comprising:
    a first supply voltage;
    a second supply voltage;
    an output node producing an output of said logic circuit;
    a plurality of logic circuits, each logic circuit including
        a first series connection between said first supply voltage and said output node consisting of
            a source-drain path of an N-channel transistor having a first threshold voltage, said N-channel transistor having a gate receiving a first logic input signal, said N-channel transistor not shared with other logic circuits of said plurality of logic circuits,
            a pull-down conditional conduction path of a pull-down network constructed exclusively of transistors having a second threshold voltage lower than said first threshold voltage, said pull-down network receiving at least one second logic input signal which determines whether said pull-down conditional conduction path conducts or does not conduct; and
        a second series connection between said second supply voltage and said output node consisting of
            a source-drain path of a P-channel transistor having said first threshold voltage, said P-channel transistor having a gate receiving an inverse of said first logic input signal, said P-channel transistor not shared with other logic circuits of said plurality of logic circuits,
            a pull-up conditional conduction path of a pull-up network constructed exclusively of transistors having said second threshold voltage, said pull-up network receiving at least one third logic input signal which determines whether said pull-up conditional conduction path conducts or does not conduct, said second and third logic input signals selected such that pull-down conditional conduction path and pull-up conditional conduction path do not conduct simultaneously.

2. The logic circuit of claim 1, wherein:
said first series connection wherein said source-drain path of said N-channel transistor is connected between said output node and a first intermediate node and said pull-down conditional conduction path is connected between said first intermediate node and said first supply voltage.

3. The logic circuit of claim 1, wherein:
said first series connection wherein said source-drain path of said N-channel transistor is connected between said first supply voltage and a first intermediate node and said pull-down conditional conduction path is connected between said first intermediate node and said output node.

4. The logic circuit of claim 1, wherein:
said second series connection wherein said source-drain path of said P-channel transistor is connected between said output node and a second intermediate node and said pull-up conditional conduction path is connected between said second intermediate node and said second supply voltage.

5. The logic circuit of claim 1, wherein:
said second series connection wherein said source-drain path of said P-channel transistor is connected between said second supply voltage and a second intermediate node and said pull-up conditional conduction path is connected between said second intermediate node and said output node.

6. The logic circuit of claim 1, wherein:
said logic circuit consists of a hybrid tri-state inverter in which
    said pull-down network consists of a source-drain path of a pull-down N-channel transistor having a gate receiving a tri-state input signal as said at least one second input signal,
    said pull-up network consists of a source-drain path of a pull-up P-channel transistor having a gate receiving said tri-state input signal as said at least one third input signal, and
    said first input signal consists of an enable signal controlling whether an inverse of said tri-state input signal is supplied to said output node or said output node is isolated from said first and second supply voltages, and
    said inverse of said first input signal consists of an inverse of said enable signal.

7. The logic circuit of claim 6, wherein:
said first series connection wherein said source-drain path of said N-channel transistor is connected between said output node and a first intermediate node and said source-drain path of said pull-down N-channel transistor is connected between said first intermediate node and said first supply voltage; and
said second series connection wherein said source-drain path of said P-channel transistor is connected between said output node and a second intermediate node and said source-drain path of said pull-up P-channel transistor is connected between said second intermediate node and said second supply voltage.

8. The logic circuit of claim 6, wherein:
said first series connection wherein said source-drain path of said N-channel transistor is connected between said first supply voltage and a first intermediate node and said source-drain path of said pull-down N-channel transistor is connected between said first intermediate node and said output node; and said second series connection wherein said source-drain path of said P-channel transistor is connected between said second supply voltage and a second intermediate node and said source-drain path of said pull-up P-channel transistor is connected between said second intermediate node and said output node.

9. The logic circuit of claim 1, wherein:

said pull-down network is constructed exclusively of N-channel transistors.

10. The logic circuit of claim 1, wherein:

said pull-up network is constructed exclusively of P-channel transistors.

11. A hybrid voltage threshold multiplexer circuit formed of metal oxide semiconductor field effect transistors comprising:

first, second, third and fourth input nodes receiving respective first, second, third and fourth input signals;

first and second control signals input nodes receiving respective first and second control signals;

a first transmission gate having an input connected to said first input node, an output and a pair of control inputs receiving said first control signal in a first phase;

a second transmission gate having an input connected to said second input node, an output and a pair of control inputs receiving said first control signal in a second phase opposite to said first phase;

a third transmission gate having an input connected to said third input node, an output and a pair of control inputs receiving said first control signal in said first phase;

a fourth transmission gate having an input connected to said fourth input node, an output and a pair of control inputs receiving said first control signal in said second phase;

a first tri-state inverter consisting of
a first series connection between a first supply voltage and an output node of a source-drain path of a first P-channel transistor having a gate receiving said second control signal and a first threshold voltage, and a source-drain path of a second P-channel transistor having a gate connected to said outputs of said first and second transmission gates and a second threshold voltage lower than said first threshold voltage,
a second series connection between a second supply voltage and said output node of a source-drain path of a first N-channel transistor having a gate receiving an inverse of said second control signal and said first threshold voltage, and a source-drain path of a second N-channel transistor having a gate connected to said outputs of said first and second transmission gates and said second threshold voltage; and a second tri-state inverter consisting of
a third series connection between said first supply voltage and said output node of a source-drain path of a third P-channel transistor having a gate receiving said inverse of said second control signal and said first threshold voltage, and a source-drain path of a fourth P-channel transistor having a gate connected to said outputs of said third and fourth transmission gates and said second threshold voltage,
a fourth series connection between said second supply voltage and said output node of a source-drain path of a third N-channel transistor having a gate receiving said second control signal and said first threshold voltage, and a source-drain path of a fourth N-channel transistor having a gate connected to said outputs of said third and fourth transmission gates and said second threshold voltage.

12. The hybrid voltage threshold multiplexer circuit of claim 11, wherein:

said first series connection wherein said source-drain path of said first P-channel transistor is connected between said first supply voltage and a first intermediate node and said source-drain path of said second P-channel transistor is connected between said first intermediate node and said output node;

said second series connection wherein said source-drain path of said first N-channel transistor is connected between said second voltage supply and a second intermediate node and said source-drain path of said second N-channel transistor is connected between said second intermediate node and said output node;

said third series connection wherein said source-drain path of said third P-channel transistor is connected between said first supply voltage and a third intermediate node and said source-drain path of said fourth P-channel transistor is connected between said third intermediate node and said output node; and said fourth series connection wherein said source-drain path of said third N-channel transistor is connected between said second voltage supply and a fourth intermediate node and said source-drain path of said fourth N-channel transistor is connected between said fourth intermediate node and said output node.

13. The hybrid voltage threshold multiplexer circuit of claim 11, wherein:

said first series connection wherein said source-drain path of said first P-channel transistor is connected between said output node and a second intermediate node and said source-drain path of said second P-channel transistor is connected between said second intermediate node and said first supply voltage;

said second series connection wherein said source-drain path of said first N-channel transistor is connected between said output node and a second intermediate node and said source-drain path of said second N-channel transistor is connected between said second intermediate node and said second voltage supply;

said third series connection wherein said source-drain path of said third P-channel transistor is connected between said output node and a third intermediate node and said source-drain path of said fourth P-channel transistor is connected between said third intermediate node and said first voltage supply; and said fourth series connection wherein said source-drain path of said third N-channel transistor is connected between said output node and a fourth intermediate node and said source-drain path of said fourth N-channel transistor is connected between said fourth intermediate node and said first supply voltage.

14. A logic circuit formed of metal oxide semiconductor field effect transistors comprising:

a first logic network connected between a first supply voltage and an output node and receiving a first input signal and at least one second input signal, said first logic network selectively connecting said first supply voltage and said output node dependent upon a state of said first input signal and at least one second input signal, said first logic network constructed exclusively of P-channel MOSFETs having a first threshold voltage;

a second logic network connected between said output node and an intermediate node and receiving said at least one second input signal, said second logic network selectively connecting said output node and said intermediate node dependent upon said state of said at least one second input signal, said second logic network constructed exclusively of N-channel MOSFETs having said first threshold voltage; and a third logic network connected between said intermediate node and a second supply voltage and receiving said first input signal, said third logic network selectively connecting said intermediate node and said second supply voltage dependent upon said state of said first input signal, said third logic network constructed exclusively of N-channel MOSFETs having a second threshold voltage higher than said first threshold voltage.

15. A hybrid voltage threshold multiplexer circuit formed of metal oxide semiconductor field effect transistors comprising:

first and second input nodes receiving respective first and second input signals;

a control signal input nodes receiving a control signal;

a first tri-state inverter consisting of
   a first series connection between a first supply voltage and an output node of a source-drain path of a first P-channel transistor having a gate receiving an inverse of said control signal and a first threshold voltage, and a source-drain path of a second P-channel transistor having a gate connected to said first input node and a second threshold voltage lower than said first threshold voltage,
   a second series connection between a second supply voltage and said output node of a source-drain path of a first N-channel transistor having a gate receiving said control signal and said first threshold voltage, and a source-drain path of a second N-channel transistor having a gate connected to said second input node and said second threshold voltage; and a second tri-state inverter consisting of
   a third series connection between said first supply voltage and said output node of a source-drain path of a third P-channel transistor having a gate receiving said control signal and said first threshold voltage, and a source-drain path of a fourth P-channel transistor having a gate connected to said second input node and said second threshold voltage,
   a fourth series connection between said second supply voltage and said output node of a source-drain path of a third N-channel transistor having a gate receiving said inverse if said control signal and said first threshold voltage, and a source-drain path of a fourth N-channel transistor having a gate connected to said second input node and said second threshold voltage.

16. The hybrid voltage threshold multiplexer circuit of claim 15, wherein:

said first series connection wherein said source-drain path of said first P-channel transistor is connected between said first supply voltage and a first intermediate node and said source-drain path of said second P-channel transistor is connected between said first intermediate node and said output node;

said second series connection wherein said source-drain path of said first N-channel transistor is connected between said second voltage supply and a second intermediate node and said source-drain path of said second N-channel transistor is connected between said second intermediate node and said output node;

said third series connection wherein said source-drain path of said third P-channel transistor is connected between said first supply voltage and a third intermediate node and said source-drain path of said fourth P-channel transistor is connected between said third intermediate node and said output node; and said fourth series connection wherein said source-drain path of said third N-channel transistor is connected between said second voltage supply and a fourth intermediate node and said source-drain path of said fourth N-channel transistor is connected between said fourth intermediate node and said output node.

17. The hybrid voltage threshold multiplexer circuit of claim 15, wherein:

said first series connection wherein said source-drain path of said first P-channel transistor is connected between said output node and a first intermediate node and said source-drain path of said second P-channel transistor is connected between said first intermediate node and said first supply voltage;

said second series connection wherein said source-drain path of said first N-channel transistor is connected between said output node and a second intermediate node and said source-drain path of said second N-channel transistor is connected between said second intermediate node and said second voltage supply;

said third series connection wherein said source-drain path of said third P-channel transistor is connected between said output node and a third intermediate node and said source-drain path of said fourth P-channel transistor is connected between said third intermediate node and said first voltage supply; and said fourth series connection wherein said source-drain path of said third N-channel transistor is connected between said output node and a fourth intermediate node and said source-drain path of said fourth N-channel transistor is connected between said fourth intermediate node and said first supply voltage.

18. A hybrid voltage threshold multiplexer circuit formed of metal oxide semiconductor field effect transistors comprising:

first and second input nodes receiving respective first and second input signals;

a control signal input node receiving a control signal;

a first tri-state inverter consisting of
   a first series connection between a first supply voltage and an output node of a source-drain path of a first P-channel transistor having a gate receiving an inverse of said control signal and a first threshold voltage, and a source-drain path of a second P-channel transistor having a gate connected to said first input node and a second threshold voltage higher than said first threshold voltage,
   a second series connection between a second supply voltage and said output node of a source-drain path of a first N-channel transistor having a gate receiving said control signal and said first threshold voltage, and a source-drain path of a second N-channel transistor having a gate connected to said second input node and said second threshold voltage; and a second tri-state inverter consisting of a third series connection between said first supply voltage and said output node of a source-drain path of a third P-channel transistor having a gate receiving said control signal and said first threshold voltage, and a source-drain path of a fourth P-channel transistor having a gate connected to said second input node and said second threshold voltage, a fourth series connection between said second supply voltage and said output node of a source-drain path of a third N-channel transistor having a gate receiving said inverse if said control signal and said first threshold voltage, and a source-drain path of a fourth N-channel transistor having a gate connected to said second input node and said second threshold voltage.

19. The hybrid voltage threshold multiplexer circuit of claim 18, wherein:

said first series connection wherein said source-drain path of said first P-channel transistor is connected between said first supply voltage and a first intermediate node and said source-drain path of said second P-channel transistor is connected between said first intermediate node and said output node;

said second series connection wherein said source-drain path of said first N-channel transistor is connected between said second voltage supply and a second intermediate node and said source-drain path of said second N-channel transistor is connected between said second intermediate node and said output node;

said third series connection wherein said source-drain path of said third P-channel transistor is connected between said first supply voltage and a third intermediate node and said source-drain path of said fourth P-channel transistor is connected between said third intermediate node and said output node; and said fourth series connection wherein said source-drain path of said third N-channel transistor is connected between said second voltage supply and a fourth intermediate node and said source-drain path of said fourth N-channel transistor is connected between said fourth intermediate node and said output node.

20. The hybrid voltage threshold multiplexer circuit of claim 18, wherein:

said first series connection wherein said source-drain path of said first P-channel transistor is connected between said output node and a first intermediate node and said source-drain path of said second P-channel transistor is connected between said first intermediate node and said first supply voltage;

said second series connection wherein said source-drain path of said first N-channel transistor is connected between said output node and a second intermediate node and said source-drain path of said second N-channel transistor is connected between said second intermediate node and said second voltage supply;

said third series connection wherein said source-drain path of said third P-channel transistor is connected between said output node and a third intermediate node and said source-drain path of said fourth P-channel transistor is connected between said third intermediate node and said first voltage supply; and said fourth series connection wherein said source-drain path of said third N-channel transistor is connected between said output node and a fourth intermediate node and said source-drain path of said fourth N-channel transistor is connected between said fourth intermediate node and said first supply voltage.

21. A logic circuit formed of metal oxide semiconductor field effect transistors comprising:

a first supply voltage;

a second supply voltage;

an output node producing a output of said logic circuit;

a first series connection between said first supply voltage and said output node consisting of
a source-drain path of an N-channel transistor having a first threshold voltage connected between said output node and an intermediate node, said N-channel transistor having a gate receiving a first input signal,
a pull-down conditional conduction path of a pull-down network connected between said intermediate node and said first supply voltage constructed exclusively of transistors having a second threshold voltage lower than said first threshold voltage; and a second series connection between said second supply voltage and said output node consisting of
a source-drain path of a P-channel transistor having said first threshold voltage, said P-channel transistor having a gate receiving an inverse of said first input signal,
a pull-up conditional conduction path of a pull-up network constructed exclusively of transistors having said second threshold voltage.

22. A logic circuit formed of metal oxide semiconductor field effect transistors comprising:

a first supply voltage;

a second supply voltage;

an output node producing a output of said logic circuit;

a first series connection between said first supply voltage and said output node consisting of
a source-drain path of an N-channel transistor having a first threshold voltage, said N-channel transistor having a gate receiving a first input signal,
a pull-down conditional conduction path of a pull-down network constructed exclusively of transistors having a second threshold voltage lower than said first threshold voltage; and a second series connection between said second supply voltage and said output node consisting of
a source-drain path of a P-channel transistor having said first threshold voltage connected between said output node and an intermediate node, said P-channel transistor having a gate receiving an inverse of said first input signal,
a pull-up conditional conduction path of a pull-up network connected between said intermediate node and said second supply voltage constructed exclusively of transistors having said second threshold voltage.

23. A logic circuit formed of metal oxide semiconductor field effect transistors comprising:

a first supply voltage;

a second supply voltage;

an output node producing a output of said logic circuit;

a first series connection between said first supply voltage and said output node consisting of
a source-drain path of an N-channel transistor having a first threshold voltage connected between said output node and a first intermediate node, said N-channel transistor having a gate receiving a first input signal, a pull-down conditional conduction path of a pull-down network connected between said first intermediate node and said first supply voltage constructed exclusively of transistors having a second threshold voltage lower than said first threshold voltage; and a second series connection between said second supply voltage and said output node consisting of a source-drain path of a P-channel transistor having said first threshold voltage connected between said output node and a second intermediate node, said P-channel transistor having a gate receiving an inverse of said first input signal, a pull-up conditional conduction path of a pull-up network connected between said second intermediate node and said second supply voltage constructed exclusively of transistors having said second threshold voltage.

* * * * *